(12) United States Patent
Feng et al.

(10) Patent No.: US 12,507,522 B2
(45) Date of Patent: Dec. 23, 2025

(54) QUANTUM DOT LIGHT EMITTING DIODE HAVING ELECTRON CONTRIBUTION LAYER, MANUFACTURING METHOD THEREOF AND DISPLAY PANEL

(71) Applicant: BOE TECHNOLOGY GROUP CO., LTD., Beijing (CN)

(72) Inventors: Jingwen Feng, Beijing (CN); Yichi Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/617,524

(22) Filed: Mar. 26, 2024

(65) Prior Publication Data

US 2024/0237389 A1    Jul. 11, 2024

Related U.S. Application Data

(63) Continuation of application No. 17/458,782, filed on Aug. 27, 2021, now Pat. No. 11,974,448.

(30) Foreign Application Priority Data

Oct. 16, 2020   (CN) .......................... 202011110885.2

(51) Int. Cl.
*H10K 50/115*    (2023.01)
*H10K 50/16*     (2023.01)
(Continued)

(52) U.S. Cl.
CPC ......... *H10K 50/115* (2023.02); *H10K 50/166* (2023.02); *H10K 71/00* (2023.02); *H10K 2102/00* (2023.02); *H10K 2102/351* (2023.02)

(58) Field of Classification Search
CPC .... H10K 50/115; H10K 50/166; H10K 71/00; H10K 2102/00; H10K 2102/351; H10K 50/16; H10K 71/12; H10K 50/171
See application file for complete search history.

(56) References Cited

U.S. PATENT DOCUMENTS 11,101,441 B2 *   8/2021   Kuo ....................... H10K 50/15
11,349,094 B2 *   5/2022   Kim ...................... H10K 50/155
(Continued)

FOREIGN PATENT DOCUMENTS

CN    106611821 A    5/2017
CN    109473561 A    3/2019
(Continued)

OTHER PUBLICATIONS

USPTO, First Office Action issued Sep. 12, 2023 for U.S. Appl. No. 17/458,782.
(Continued)

*Primary Examiner* — Caleb E Henry
(74) *Attorney, Agent, or Firm* — HOUTTEMAN LAW LLC (57) ABSTRACT

The present disclosure provides a quantum dot light emitting diode, including: a first electrode, a second electrode, a quantum dot light emitting layer between the first electrode and the second electrode, at least one electron transport layer between the quantum dot light emitting layer and the first electrode, and an electron contribution layer between the electron transport layer of the at least one electron transport layer closest to the first electrode and the quantum dot light emitting layer; a material of the electron contribution layer includes a metal material. The embodiment of the present disclosure also provides a method for manufacturing the quantum dot light emitting diode and a display panel.

16 Claims, 7 Drawing Sheets

(51) Int. Cl.
*H10K 71/00* (2023.01)
*H10K 102/00* (2023.01)

(56) References Cited

U.S. PATENT DOCUMENTS

| | | | | |
|---|---|---|---|---|
| 11,974,448 B2* | 4/2024 | Feng | | H10K 50/166 |
| 2007/0103068 A1* | 5/2007 | Bawendi | | B82Y 30/00 |
| | | | | 313/506 |
| 2008/0150425 A1* | 6/2008 | Cho | | H05B 33/22 |
| | | | | 313/506 |
| 2010/0140586 A1* | 6/2010 | Char | | C01G 11/00 |
| | | | | 257/14 |
| 2010/0213438 A1* | 8/2010 | Cho | | H10K 50/115 |
| | | | | 438/47 |
| 2011/0220880 A1* | 9/2011 | Cheng | | C07D 271/107 |
| | | | | 548/266.2 |
| 2011/0291071 A1* | 12/2011 | Kim | | H10K 50/115 |
| | | | | 438/34 |
| 2012/0138894 A1* | 6/2012 | Qian | | H10K 50/115 |
| | | | | 257/E33.012 |
| 2014/0322478 A1* | 10/2014 | Mori | | C08J 7/042 |
| | | | | 428/142 |
| 2014/0367721 A1* | 12/2014 | Mahler | | H10H 20/8513 |
| | | | | 977/773 |
| 2015/0076469 A1* | 3/2015 | Ikemizu | | H10K 50/11 |
| | | | | 257/40 |
| 2016/0099415 A1* | 4/2016 | Li | | H10K 85/654 |
| | | | | 548/440 |
| 2016/0155946 A1* | 6/2016 | Blouin | | C08G 61/126 |
| | | | | 252/511 |
| 2017/0141317 A1* | 5/2017 | Mitchell | | H10K 85/113 |
| 2018/0062100 A1* | 3/2018 | Xu | | H10K 50/171 |
| 2018/0151814 A1* | 5/2018 | Hirose | | H10K 85/50 |
| 2018/0182977 A1* | 6/2018 | Hirose | | H10K 85/6577 |
| 2018/0254421 A1* | 9/2018 | Kinge | | H10K 50/115 |
| 2018/0261783 A1* | 9/2018 | Yun | | H10K 50/82 |
| 2018/0286927 A1* | 10/2018 | Xiao | | H10K 50/19 |
| 2019/0006541 A1* | 1/2019 | So | | H10K 30/353 |
| 2019/0011782 A1* | 1/2019 | Pickett | | C09K 11/883 |
| 2019/0131557 A1* | 5/2019 | Lee | | H10K 50/166 |
| 2019/0181202 A1* | 6/2019 | Lim | | H10K 50/19 |
| 2019/0198796 A1* | 6/2019 | Kim | | H10K 50/12 |
| 2019/0273214 A1* | 9/2019 | Li | | H10K 50/115 |
| 2019/0288225 A1* | 9/2019 | Chen | | H10K 50/115 |
| 2019/0288229 A1* | 9/2019 | Kim | | H10K 85/649 |
| 2019/0288230 A1* | 9/2019 | Kim | | H10K 85/111 |
| 2019/0296255 A1* | 9/2019 | Kim | | H10K 71/00 |
| 2019/0326539 A1* | 10/2019 | Chung | | H10K 59/12 |
| 2019/0372057 A1* | 12/2019 | Park | | H10K 50/816 |
| 2020/0075883 A1* | 3/2020 | Kim | | H10K 50/16 |
| 2020/0168826 A1* | 5/2020 | You | | H10K 50/16 |
| 2020/0176692 A1* | 6/2020 | Watabe | | H10K 59/879 |
| 2020/0266372 A1* | 8/2020 | Kuo | | H10K 71/00 |
| 2020/0321546 A1* | 10/2020 | He | | H10K 50/115 |
| 2021/0183999 A1* | 6/2021 | Kwon | | H10H 20/818 |
| 2021/0324268 A1* | 10/2021 | Yang | | G02B 6/005 |
| 2022/0123248 A1* | 4/2022 | Feng | | H10K 50/16 |
| 2022/0199924 A1* | 6/2022 | Kobashi | | G09F 9/33 |
| 2022/0199925 A1* | 6/2022 | Kobashi | | H10K 50/115 |
| 2022/0204844 A1* | 6/2022 | Won | | C01B 19/007 |
| 2024/0237389 A1* | 7/2024 | Feng | | H10K 71/00 |

FOREIGN PATENT DOCUMENTS

| | | |
|---|---|---|
| CN | 110649167 A | 1/2020 |
| CN | 111384262 A | 7/2020 |
| CN | 214068751 U | 8/2021 |

OTHER PUBLICATIONS

USPTO, Notice of allowance issued Jan. 9, 2024 for U.S. Appl. No. 17/458,782.
USPTO, Requirement of restriction issued Jun. 16, 2023 for U.S. Appl. No. 17/458,782.
China Patent Office, First Office Action issued Mar. 9, 2021 for application No. CN202022310626.6.
China Patent Office, First Office Action, issued May 29, 2024, Appl'n No. CN202011110885.2.
Kim et al., "Solution Processed Metal-Oxide P—N Charge Generation Junction for High Performance Inverted Quantum-dot Light Emitting Diodes," Applied Materials & Interfaces, Oct. 18, 2017, pp. 1-29, (Just Accepted Ver.).

* cited by examiner

QUANTUM DOT LIGHT EMITTING DIODE HAVING ELECTRON CONTRIBUTION LAYER, MANUFACTURING METHOD THEREOF AND DISPLAY PANEL

CROSS REFERENCE TO RELATED APPLICATIONS

This is a continuation application of U.S. patent application Ser. No. 17/458,782, filed on Aug. 27, 2021, an application claiming the priority of the Chinese Patent Application No. 202011110885.2 filed on Oct. 16, 2020, the contents of both are hereby incorporated by reference in their entireties.

TECHNICAL FIELD

The present disclosure relates to the field of display technology, and in particular to a quantum dot light emitting diode, a manufacturing method thereof and a display panel.

BACKGROUND

A quantum dot light emitting diode (QLED) generally includes a light emitting layer having a plurality of quantum dot nanocrystals and sandwiched between an electron transport layer and a hole transport layer. An electric field is applied to the quantum dot light emitting diode, causing electrons and holes to move into the light emitting layer where they are trapped in the quantum dots and recombined with each other, for emitting photons. Compared with an organic light emitting diode, the quantum dot light emitting diode has a narrower emission spectrum.

SUMMARY

The present disclosure provides a quantum dot light emitting diode, a manufacturing method thereof and a display panel.

In a first aspect, the embodiment of the present disclosure provides a quantum dot light emitting diode, including: a first electrode, a second electrode, a quantum dot light emitting layer between the first electrode and the second electrode, at least one electron transport layer between the quantum dot light emitting layer and the first electrode, and an electron contribution layer between an electron transport layer of the at least one electron transport layer closest to the first electrode and the quantum dot light emitting layer; a material of the electron contribution layer includes a metal material.

In some embodiments, a work function of the metal material is less than 4 eV.

In some embodiments, the metal material includes: at least one of magnesium, lithium and cesium.

In some embodiments, a thickness of the electron contribution layer is in a range of 1 nm to 100 nm.

In some embodiments, the at least one electron transport layer comprises one electron transport layer, the electron contribution layer is between the electron transport layer and the quantum dot light emitting layer.

In some embodiments, the at least one electron transport layer comprises a plurality of electron transport layers, the electron contribution layer is between any two adjacent electron transport layers in the plurality of electron transport layers.

In some embodiments, a material of the quantum dot light emitting layer includes: at least one of indium phosphide quantum dots or indium phosphide derived quantum dots having a core-shell structure, blue light cadmium-containing quantum dots, GaP/ZnSe, $CsPbBr_3$/ZnS; a material of the electron transport layer includes: at least one of zinc oxide, magnesium zinc oxide, aluminum zinc oxide and magnesium aluminum zinc oxide.

In some embodiments, the quantum dot light emitting diode further includes a hole transport layer and a hole injection layer; the hole transport layer is between the second electrode and the quantum dot light emitting layer, and the hole injection layer is between the second electrode and the hole transport layer.

In a second aspect, the embodiment of the present disclosure further provide a display panel, including: a quantum dot light emitting diode as described herein or manufactured according to the methods described herein.

In a third aspect, the embodiment of the present disclosure further provide a method for manufacturing a quantum dot light emitting diode, including steps of: forming a first electrode, a second electrode, a quantum dot light emitting layer between the first electrode and the second electrode, at least one electron transport layer between the quantum dot light emitting layer and the first electrode, and an electron contribution layer between an electron transport layer of the at least one electron transport layer closest to the first electrode and the quantum dot light emitting layer; wherein a material of the electron contribution layer includes a metal material.

In some embodiments, the at least one electron transport layer comprises one electron transport layer; the step of forming the first electrode, the second electrode, the quantum dot light emitting layer, the at least one electron transport layer, and the electron contribution layer includes steps of: forming the first electrode on a substrate; forming the electron transport layer on a side of the first electrode distal to the substrate; forming the electron contribution layer on a side of the electron transport layer distal to the first electrode; forming the quantum dot light emitting layer on a side of the electron contribution layer distal to the electron transport layer; forming the second electrode on a side of the quantum dot light emitting layer distal to the electron contribution layer.

In some embodiments, the at least one electron transport layer comprises one electron transport layer; the step of forming the first electrode, the second electrode, the quantum dot light emitting layer, the at least one electron transport layer, and the electron contribution layer includes steps of: forming the second electrode on a substrate; forming the quantum dot light emitting layer on a side of the second electrode distal to the substrate; forming the electron contribution layer on a side of the quantum dot light emitting layer distal to the second electrode; forming the electron transport layer on a side of the electron contribution layer distal to the quantum dot light emitting layer; forming the first electrode on a side of the electron transport layer distal to the electron contribution layer.

In some embodiments, the at least one electron transport layer includes a first electron transport layer and a second electron transport layer, the first electron transport layer is closer to the first electrode than the second electron transport layer; the step of forming the first electrode, the second electrode, the quantum dot light emitting layer, the at least one electron transport layer, and the electron contribution layer includes steps of: forming the first electrode on a substrate; forming the first electron transport layer on a side of the first electrode distal to the substrate; forming the electron contribution layer on a side of the first electron transport layer distal to the first electrode; forming the second electron transport layer on a side of the electron contribution layer distal to the first electron transport layer; forming the quantum dot light emitting layer on a side of the second electron transport layer distal to the electron contribution layer; forming the second electrode on a side of the quantum dot light emitting layer distal to the second electron transport layer.

In some embodiments, the at least one electron transport layer includes a first electron transport layer and a second electron transport layer, the first electron transport layer is closer to the first electrode than the second electron transport layer; the step of forming the first electrode, the second electrode, the quantum dot light emitting layer, the at least one electron transport layer, and the electron contribution layer includes steps of: forming the second electrode on a substrate; forming the quantum dot light emitting layer on a side of the second electrode distal to the substrate; forming the second electron transport layer on a side of the quantum dot light emitting layer distal to the second electrode; forming the electron contribution layer on a side of the second electron transport layer distal to the quantum dot light emitting layer; forming the first electron transport layer on a side of the electron contribution layer distal to the second electron transport layer; forming the first electrode on a side of the first electron transport layer distal to the electron contribution layer.

In some embodiments, a work function of the metal material is less than 4 eV.

In some embodiments, a thickness of the electron contribution layer is in a range of 1 nm to 100 nm.

In some embodiments, a material of the quantum dot light emitting layer includes: at least one of indium phosphide quantum dots or indium phosphide derived quantum dots having a core-shell structure, blue light cadmium-containing quantum dots, GaP/ZnSe, CsPbBr3/ZnS; a material of the electron transport layer includes: at least one of zinc oxide, magnesium zinc oxide, aluminum zinc oxide and magnesium aluminum zinc oxide.

In some embodiments, the metal material includes: at least one of magnesium, lithium and cesium.

BRIEF DESCRIPTION OF DRAWINGS

Drawings are included to provide a further understanding of some embodiments of the present disclosure, constitute a part of the specification, and explain the present disclosure together with some embodiments of the present disclosure, but do not limit the present disclosure. The above and other features and advantages will become more apparent to one of ordinary skill in the art by describing in detail exemplary embodiments with reference to the drawings, in which.

DETAIL DESCRIPTION OF EMBODIMENTS

In order to make one of ordinary skill in the art better understand the technical solution of the present disclosure, a quantum dot light emitting diode, a manufacturing method thereof, a display panel, and a display device provided in the present disclosure are described in detail below with reference to the drawings.

Some embodiments of the present disclosure will be described more fully hereinafter with reference to the drawings, but the embodiments shown may be embodied in different forms and should not be construed as limited to the embodiments set forth herein. Rather, these embodiments are provided so that this disclosure will be thorough and complete, and will fully convey the scope of the present disclosure to one of ordinary skill in the art.

Some embodiments of the present disclosure may be described with reference to plan and/or cross-sectional views by way of idealized schematic illustrations of the present disclosure. Accordingly, the example illustrations may be modified in accordance with manufacturing techniques and/or tolerances.

Embodiments of the present disclosure and features of the embodiments may be combined with each other without conflict.

The terms used in the present disclosure are only used for describing particular embodiments and are not intended to limit the present disclosure. As used in this disclosure, the term "and/or" includes any and all combinations of one or more associated listed items. As used in this disclosure, the singular forms "a", "an" and "the" are intended to include the plural forms as well, unless the context clearly indicates otherwise. The terms "including", "comprising", "made of", as used in this disclosure, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used in this disclosure have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense, unless expressly so defined herein.

Some embodiments of the present disclosure are not limited to the embodiments shown in the drawings, but include modifications of configurations formed based on manufacturing processes. Thus, regions illustrated in the drawings have schematic properties, and their shapes illustrate specific shapes of regions of elements, but are not intended to be limiting.

In general, a basic structure of a light emitting device includes: an anode, a cathode, and a light emitting layer between the anode and the cathode. Under the action of an applied voltage, electrons and holes are injected from the cathode and the anode, respectively, then migrate, and meet and recombine in the light emitting layer, thereby generating excitons. The energy of the excitons is attenuated in the form of light, that is, the light is radiated. When the light emitting device is a quantum dot light emitting diode, the light emitting layer is a quantum dot light emitting layer; the quantum dot light emitting layer is made of a quantum dot material as the name implies.

The light emitting device may be a normal structured light emitting device or an inverted structured light emitting device. The light emitting device generally includes a substrate. In the case of the normal structured light emitting device, an anode is closer to the substrate than a cathode. In the case of the inverted structured light emitting device, a cathode is closer to the substrate than an anode. Whether the light emitting device is the normal structured light emitting device or the inverted structured light emitting device, the light emitting device may be a top emission light emitting device or a bottom emission light emitting device. When the light emitting device is a normal structured top emission light emitting device, an anode is a reflective electrode and a cathode is a transmissive electrode; when the light emitting device is a normal structured bottom emission light emitting device, an anode is a transmissive electrode and a cathode is a reflective electrode; when the light emitting device is an inverted structured top emission light emitting device, an anode is a transmissive electrode and a cathode is a reflective electrode; when the light emitting device is an inverted structured bottom emission light emitting device, an anode is a reflective electrode and a cathode is a transmissive electrode.

With the continuous optimization of performances of the light emitting device, the light emitting device not only includes the anode, the cathode and the light emitting layer; a hole injection layer (HIL), a hole transport layer (HTL), and an electron transport layer (ETL) may be disposed between the anode and the light emitting layer. Further, an electron injection layer (EIL) may be further disposed between the electron transport layer and the cathode.

At present, a cadmium-free (Cd-free) quantum dot material or a blue light cadmium-containing quantum dot material is generally used as the quantum dot light emitting layer. In practical applications and tests, in the quantum dot light emitting diode in which the cadmium-free quantum dot material or the blue light cadmium-containing quantum dot material is used as the quantum dot light emitting layer, the problem, that the light emitting efficiency of the device is low due to unbalanced carrier transmission, exists. The main reasons are in that an electron injection rate of the quantum dot light emitting layer is smaller than a hole injection rate, causing unbalanced carrier injection, so that holes are excessively accumulated in the quantum dot light emitting layer, causing the charging quantum dot light emitting layer in the device, which adversely affects the service life and the light emitting efficiency of the quantum dot light emitting diode.

In order to solve the above technical problem, the embodiments of the present disclosure provide a quantum dot light emitting diode, a manufacturing method thereof, a display panel, and a display device.

Figure 1:
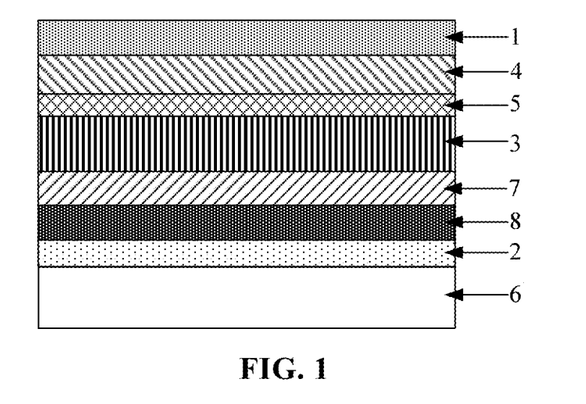
FIG. 1 is a schematic structural diagram of a quantum dot light emitting diode according to an embodiment of the present disclosure.

FIG. 1 is a schematic structural diagram of a quantum dot light emitting diode according to an embodiment of the present disclosure. As shown in FIG. 1, the quantum dot light emitting diode includes: a first electrode 1, a second electrode 2, a quantum dot light emitting layer 3, at least one electron transport layer 4 and an electron contribution (supply) layer 5. The quantum dot light emitting layer 3 is arranged between the first electrode 1 and the second electrode 2, the at least one electron transport layer 4 is arranged between the quantum dot light emitting layer 3 and the first electrode 1, and the electron contribution layer 5 is arranged between an electron transport layer 4 of the at least one electron transport layer 4 closest to the first electrode 1 and the quantum dot light emitting layer 3.

A material of the electron contribution layer 5 includes a metal material, and is configured to inject free electrons on a surface of the electron contribution layer 5 into the quantum dot light emitting layer 3 under the action of an electric field between the first electrode 1 and the second electrode 2.

In the embodiment of the present disclosure, the first electrode 1 serves as a cathode and the second electrode 2 serves as an anode.

In the embodiment of the present disclosure, during the operation of the quantum dot light emitting diode, different voltages are applied on the first electrode 1 and the second electrode 2 (the voltage applied on the second electrode 2 is greater than that on the first electrode 1), so that an electric field is formed between the first electrode 1 and the second electrode 2, and has a direction from the second electrode 2 to the first electrode 1. Since the metal material in the electron contribution layer 5 contains a large amount of free electrons, which move to the quantum dot light emitting layer 3 under the action of the electric field between the first electrode 1 and the second electrode 2, the number of electrons injected into the quantum dot light emitting layer 3 per unit time is increased (the electron contribution layer 5 partially contributes to electron injection). After the free electrons in the metal material in the electron contribution layer 5 are reduced, the metal material with reduced electrons attracts the electrons in the first electrode 1, so that the electrons are continuously injected from the first electrode 1 to the electron contribution layer 5. Based on the process, an electron transport rate between the first electrode 1 and the quantum dot light emitting layer 3 is increased, and electrons injected into the quantum dot light emitting layer 3 per unit time are increased, so that the unbalanced injection between holes and electrons at the quantum dot light emitting layer 3 is favorably alleviated or even eliminated, and thus, the service life and the light emitting efficiency of the quantum dot light emitting diode may be improved.

In some embodiments, a material of the quantum dot light emitting layer 3 may be InP (indium phosphide) quantum dots or indium phosphide derived quantum dots having a core-shell structure, such as InP/ZnSe/ZnS, InP/ZnSeS/ZnS; also may be blue light cadmium-containing quantum dots such as CdS/ZnSe/ZnS, CdSe/ZnSe/ZnS, CdSInS/ZnSe/ZnS; and also may be quantum dots, such as GaP/ZnSe, $CsPbBr_3$/ZnS.

In some embodiments, a material of the electron transport layer 4 includes: at least one of zinc oxide (ZnO), magnesium zinc oxide, aluminum zinc oxide, and magnesium aluminum zinc oxide.

In some embodiments, a work function of the metal material is less than 4.0 eV. The smaller the work function of the metal material is, the more easily electrons escape from metal atoms, to form free electrons. That is, the more free electrons in the metal material are, the more electrons injected from the electron contribution layer 5 to the quantum dot light emitting layer 3 are. Therefore, in the embodiment of the present disclosure, the electron contribution layer 5 may be made of a metal material having a low work function.

In some embodiments, the metal material includes: at least one of magnesium (Mg), lithium (Li), cesium (Cs); where the work function WF for Mg is about 3.66 eV, for Li is about 2.9 eV, and for Cs is about 2.14 eV.

In the embodiment of the present disclosure, a thickness and a position of the electron contribution layer 5 also have an effect on the number of electrons injected from the electron contribution layer 5 to the quantum dot light emitting layer 3.

In some embodiments, where the material and the position of electron contribution layer 5 are known, the greater the thickness of electron contribution layer 5 is, the more free electrons in electron contribution layer 5 are, the greater the number of electrons that may be injected to quantum dot light emitting layer 3 per unit time is; conversely, the smaller the thickness of the electron contribution layer 5 is, the less free electrons in the electron contribution layer 5 are, and the smaller the number of electrons that may be injected into the quantum dot light emitting layer 3 per unit time is. Therefore, the electron transport rate between the first electrode 1 and the quantum dot light emitting layer 3 may be controlled by adjusting the thickness of the electron contribution layer 5, and thus, the number of electrons injected into the quantum dot light emitting layer 3 per unit time is controlled, so as to achieve the purpose of alleviating or even eliminating the unbalanced injection between holes and electrons at the quantum dot light emitting layer 3. In some embodiments, the thickness of the electron contribution layer 5 may be in the range of 1 nm to 100 nm, wherein the thickness of the electron contribution layer 5 may be 1 nm or 100 nm.

When the quantum dot light emitting diode is a normal structured top emission quantum dot light emitting diode or an inverted structured bottom emission quantum dot light emitting diode (a side where the first electrode 1 is provided is the light outgoing side), the thickness of the electron contribution layer 5 affects the light emitting efficiency of the quantum dot light emitting diode. The greater the thickness of the electron contribution layer 5 is, the lower the light transmittance thereof is, and the lower the light emitting efficiency of the quantum dot light emitting diode is. Considering these factors, such as the amount of electrons injected by the electron contribution layer 5 and the light emitting efficiency of the quantum dot light emitting diode, in some embodiments, the thickness of the electron contribution layer 5 may be in the range of 1 nm to 10 nm, wherein the thickness of the electron contribution layer 5 may be 1 nm or 10 nm.

In the case where the material and the thickness of the electron contribution layer 5 are known, the greater a distance between the electron contribution layer 5 and the quantum dot light emitting layer 3 is, the greater a distance, by which the electrons in the electron contribution layer 5 move to the quantum dot light emitting layer 3, is, the greater the probability, that the electrons collide with other atoms during the movement, is. Since the kinetic energy of the electrons is reduced after the collision occurs, the number of electrons which cannot reach the quantum dot light emitting layer 3 is increased, so that the number of electrons which may be actually injected into the quantum dot light emitting layer 3 per unit time is reduced. Conversely, the smaller a distance between the electron contribution layer 5 and the quantum dot light emitting layer 3 is, the smaller a distance, by which the electrons in the electron contribution layer 5 move to the quantum dot light emitting layer 3, is, the smaller the probability, that the electrons collide with other atoms during the movement, is. Therefore, the number of electrons with the kinetic energy reduced after the collision occurs is reduced, the number of electrons which may reach the quantum dot light emitting layer 3 is increased, so that the number of electrons which may be injected into the quantum dot light emitting layer 3 per unit time is reduced. Therefore, by adjusting the distance between the electron contribution layer 5 and the quantum dot light emitting layer 3, the number of electrons injected into the quantum dot light emitting layer 3 per unit time may be controlled, so as to achieve the purpose of alleviating or even eliminating the unbalanced injection between holes and electrons at the quantum dot light emitting layer 3.

In some embodiments, as shown in FIG. 1, the quantum dot light emitting diode further includes a hole transport layer 7 located between the second electrode 2 and the quantum dot light emitting layer 3, and a hole injection layer 8 located between the second electrode 2 and the hole transport layer 7.

In some embodiments, a material of the hole injection layer 8 includes, but is not limited to, poly (3,4-ethylenedioxythiophene monomer) polystyrene sulfonate (PEDOT: PSS), polythiophene, polyaniline, polypyrrole, copper phthalocyanine.

In some embodiments, a material of the hole transport layer 7 includes, but is not limited to, p-type polymer materials and various p-type materials having a low molecular weight, such as, polythiophene, polyaniline, polypyrrole, a mixture having poly-3, 4-ethylenedioxythiophene and poly (sodium p-styrenesulfonate), 4,4'-cyclohexylidene bis [N,N-bis (4-methylphenyl) aniline] (TAPC), or 4,4', 4"-tris (N-carbazolyl) triphenylamine (TCTA), N,N'-bis (1-naphthyl)—N,N'-diphenylbenzidine (NPB).

In some embodiments, an electron injection layer (not shown) is further disposed between the electron transport layer 4 and the first electrode 1; a material of the electron injection layer includes, but is not limited to, any one of lithium fluoride, sodium fluoride, potassium fluoride, rubidium fluoride, cesium fluoride, lithium oxide, and lithium metaborate.

It should be noted that only one electron transport layer 4 is exemplarily shown in FIG. 1, and the electron contribution layer 5 is located between the electron transport layer 4 and the quantum dot light emitting layer 3 and is in contact with the quantum dot light emitting layer 3, which only serves as an exemplary function and does not limit the technical solution of the present disclosure.

With continued reference to FIG. 1, the quantum dot light emitting diode shown in FIG. 1 further includes a substrate 6 located on a side of the second electrode 2 distal to the first electrode 1, therefore, such a quantum dot light emitting diode is a normal structured quantum dot light emitting diode.

Figure 2:
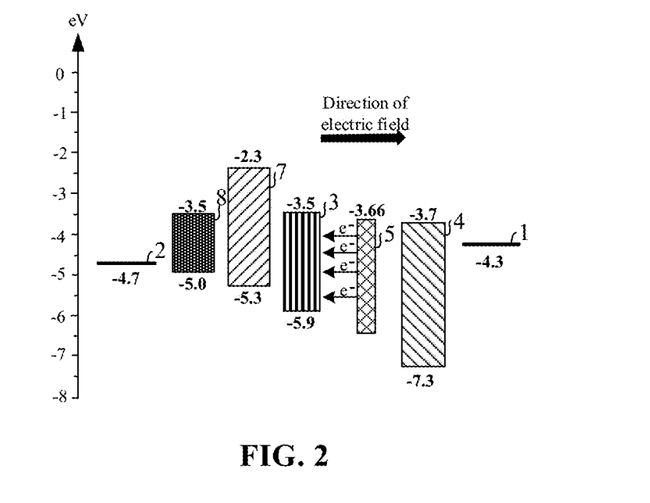
FIG. 2 is a schematic diagram illustrating energy levels and an electron contribution principle of layers in a quantum dot light emitting diode according to an embodiment of the present disclosure.

FIG. 2 is a schematic diagram illustrating energy levels of layers and the electron contribution principle in a quantum dot light emitting diode according to an embodiment of the present disclosure. As a specific example, as shown in FIG. 2, the material of the first electrode 1 is aluminum, and a fermi level of the aluminum is about −4.3 eV; the electron transport layer 4 is made of magnesium zinc oxide, and energy levels of the magnesium zinc oxide are as follows: a valence band being about −7.3 eV and a conduction band being about −3.7 eV; the material of the electron contribution layer 5 is magnesium, and a conduction band of the magnesium is about −3.66 eV (a work function is about 3.66 eV); the quantum dot light emitting layer 3 is made of InP/ZnSeS/ZnS, and the InP/ZnSeS/ZnS has energy levels as follows: a valence band being about −5.9 eV and a conduction band being about −3.5 eV; the hole transport layer 7 is made of poly (9,9-dioctyl fluorene-CO—N-(4-butyl phenyl) diphenylamine) (TFB), and energy levels of the TFB are as follows: a valence band being about −5.3 eV and a conduction band being about −2.3 eV; the material of the hole transport layer 7 is PEDOT: PSS, energy levels of PEDOT: PSS are as follows: a valence band being about −5.0 eV and a conduction band being about −3.5 eV; the second electrode 2 is made of Indium Tin Oxide (ITO) with a fermi level of about −4.7 eV.

When the quantum dot light emitting diode operates, the direction of the electric field points to the first electrode 1 from the second electrode 2, and the electron contribution layer 5 injects free electrons to the quantum dot light emitting layer 3.

Figure 3:
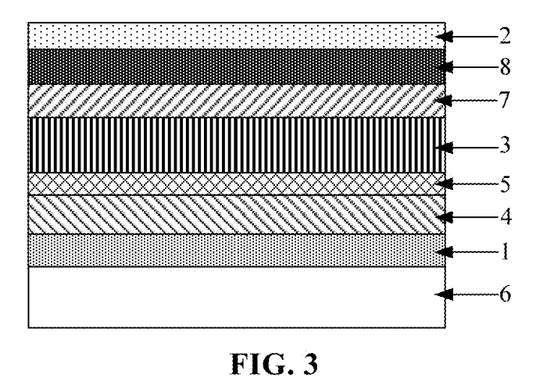
FIG. 3 is a schematic structural diagram of a quantum dot light emitting diode according to an embodiment of the present disclosure.

FIG. 3 is a schematic structural diagram of a quantum dot light emitting diode provided in an embodiment of the present disclosure. As shown in FIG. 3, unlike the quantum dot light emitting diode shown in FIG. 1, the substrate 6 shown in FIG. 3 is located on a side of the first electrode 1 distal to the second electrode 2, and thus, the quantum dot light emitting diode is an inverted structured quantum dot light emitting diode.

In some embodiments of the present disclosure, the at least one electron transport layer 4 is a plurality of electron transport layers, and the electron contribution layer 5 is located between any two adjacent electron transport layers in the plurality of electron transport layers. The following description will be given by taking as an example that the at least one electron transport layer 4 includes an electron transport layer 4a and an electron transport layer 4b.

Figure 4:
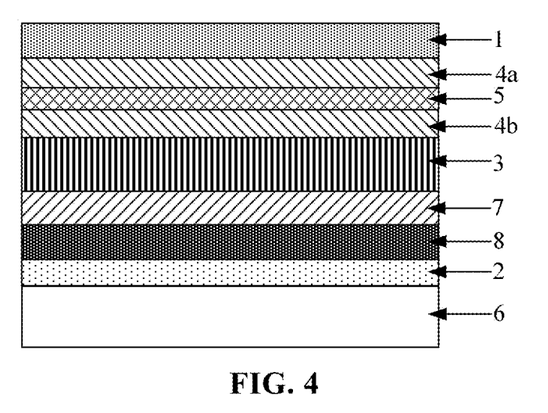
FIG. 4 is a schematic structural diagram of a quantum dot light emitting diode according to the embodiment of the present disclosure.

FIG. 4 is a schematic structural diagram of a quantum dot light emitting diode according to an embodiment of the present disclosure. As shown in FIG. 4, unlike the quantum dot light emitting diodes shown in FIGS. 1 and 3, the quantum dot light emitting diode shown in FIG. 4 includes two electron transport layers 4a and 4b, and the electron contribution layer 5 is located between the two electron transport layers 4a and 4b.

For convenience of description, the two electron transport layers 4a, 4b are referred to as a first electron transport layer 4a and a second electron transport layer 4b, respectively, and the first electron transport layer 4a is closer to the first electrode 1 than the second electron transport layer 4b. The second electron transport layer 4b is located between the quantum dot light emitting layer 3 and the electron contribution layer 5, so that by controlling a thickness of the second electron transport layer 4b, the distance between the electron contribution layer 5 and the quantum dot light emitting layer 3 may be controlled that is, the number of free electrons injected into the quantum dot light emitting layer 3 from the electron contribution layer 5 is controlled, so as to control the electron transport rate between the first electrode 1 and the quantum dot light emitting layer 3.

It should be noted that, in the embodiment of the present disclosure, materials of the first electron transport layer 4a and the second electron transport layer 4b may be the same or different; thicknesses of the first electron transport layer 4a and the second electron transport layer 4b may be the same or different.

The substrate 6 in FIG. 4 is located on a side of the second electrode 2 distal to the first electrode 1, and thus, the quantum dot light emitting diode is a normal structured quantum dot light emitting diode.

Figure 5:
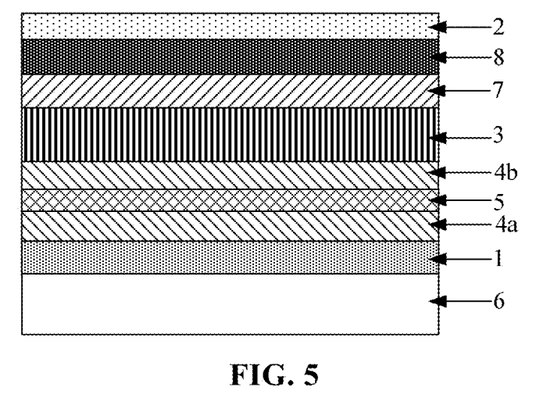
FIG. 5 is a schematic structural diagram of a quantum dot light emitting diode according to an embodiment of the present disclosure.

FIG. 5 is a schematic structural diagram of a quantum dot light emitting diode according to an embodiment of the present disclosure. As shown in FIG. 5, unlike the quantum dot light emitting diode shown in FIG. 4, the substrate 6 shown in FIG. 5 is located on a side of the first electrode 1 distal to the second electrode 2, and thus, the quantum dot light emitting diode is an inverted structured quantum dot light emitting diode.

Alternatively, the number of the electron transport layers in the embodiment of the present disclosure may also be three or more, the material and the thickness of each electron transport layer are not limited, and it is only necessary to ensure that the electron contribution layer 5 is disposed between the electron transport layer closest to the first electrode 1 and the quantum dot light emitting layer 3, and specific cases are not described herein.

In some embodiments, the hole injection layer, the hole transport layer in FIGS. 1, 3, 4 and 5 may be removed.

In the embodiment of the present disclosure, the electron contribution layer is provided, free electrons of the metal material in the electron contribution layer may be injected into the quantum dot light emitting layer under the action of the electric field, so that an electron transport rate between the first electrode and the quantum dot light emitting layer is increased, and electrons injected into the quantum dot light emitting layer per unit time are increased, the electron injection per unit time at the quantum dot light emitting layer is increased, so that the unbalanced injection between holes and electrons at the quantum dot light emitting layer is favorably alleviated or even eliminated, and thus, the service life and the light emitting efficiency of the quantum dot light emitting diode may be improved.

The embodiment of the present disclosure further provides a method for manufacturing the quantum dot light emitting diode, which is used for manufacturing the quantum dot light emitting diode provided by any one of the embodiments. The manufacturing method includes: forming a first electrode, a second electrode, a quantum dot light emitting layer, at least one electron transport layer and an electron contribution layer, wherein the quantum dot light emitting layer is arranged between the first electrode and the second electrode, the at least one electron transport layer is arranged between the quantum dot light emitting layer and the first electrode, and the electron contribution layer is arranged between an electron transport layer closest to the first electrode and the quantum dot light emitting layer; wherein a material of the electron contribution layer includes a metal material, and the electron contribution layer is configured to inject free electrons on a metal surface to the quantum dot light emitting layer under the action of an electric field between the first electrode and the second electrode.

In the embodiment of the present disclosure, the electron contribution layer is provided, free electrons of the metal material in the electron contribution layer may be injected into the quantum dot light emitting layer under the action of the electric field, so that an electron transport rate between the first electrode and the quantum dot light emitting layer is increased, and electrons injected into the quantum dot light emitting layer per unit time are increased, the electron injection per unit time at the quantum dot light emitting layer is increased, so that the unbalanced injection between holes and electrons at the quantum dot light emitting layer is favorably alleviated or even eliminated, and thus, the service life and the light emitting efficiency of the quantum dot light emitting diode may be improved.

Figure 6:
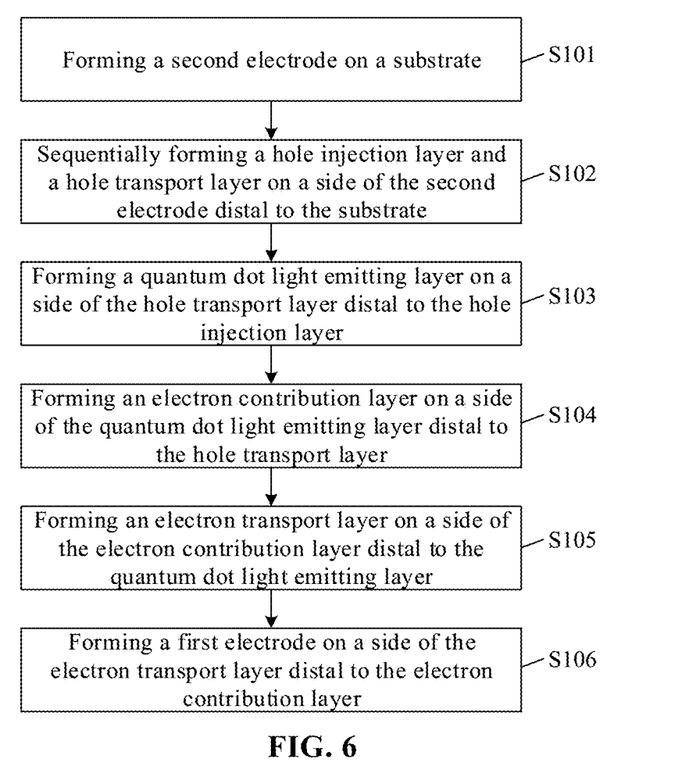
FIG. 6 is a flowchart of a method for manufacturing a quantum dot light emitting diode according to an embodiment of the present disclosure.

FIG. 6 is a flowchart of a method for manufacturing a quantum dot light emitting diode according to an embodiment of the present disclosure. FIGS. 7a to 7e are schematic diagrams of structures at various processes of the method for manufacturing a quantum dot light emitting diode shown in FIG. 6. As shown in FIGS. 6 to 7e, the manufacturing method may be used for manufacturing the quantum dot light emitting diode shown in FIG. 1, and specifically includes the following steps:

S101, forming a second electrode on a substrate.

Figure 7A:
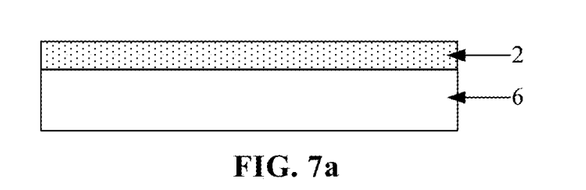
FIGS. 7a to 7e are schematic diagrams of structures at various processes of the method for manufacturing a quantum dot light emitting diode shown in FIG. 6.

Referring to FIG. 7a, in step S101, a thin layer of a conductive material (e.g., a thin film of an Indium Tin Oxide (ITO) material) is formed on the substrate, and then, is patterned, to form a pattern of the second electrode.

S102, sequentially forming a hole injection layer and a hole transport layer on a side of the second electrode distal to the substrate.

Figure 7B:
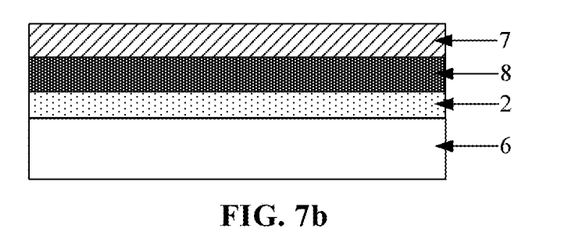

Referring to FIG. 7b, firstly, the hole injection layer is formed on a side of the second electrode distal to the substrate, and then, the hole transport layer is formed on a side of the hole injection layer distal to the substrate. In some embodiments, the hole injection layer and the hole transport layer are generally made of organic polymers, and may be formed through a spin coating process.

In some embodiments, the material of the hole injection layer 8 includes, but is not limited to, poly (3,4-ethylenedioxythiophene monomer) polystyrene sulfonate (PEDOT: PSS), polythiophene, polyaniline, polypyrrole, copper phthalocyanine.

In some embodiments, a material of the hole transport layer 7 includes, but is not limited to, p-type polymer materials and various p-type materials having a low molecular weight, such as, polythiophene, polyaniline, polypyrrole, a mixture having poly-3, 4-ethylenedioxythiophene and poly (sodium p-styrenesulfonate), 4,4'-cyclohexylidene bis [N,N-bis (4-methylphenyl) aniline] (TAPC), or 4, 4', 4"-tris (N-carbazolyl) triphenylamine (TCTA), N,N'-bis (1-naphthyl)-N,N'-diphenylbenzidine (NPB).

S103, forming a quantum dot light emitting layer on a side of the hole transport layer distal to the hole injection layer.

Figure 7C:
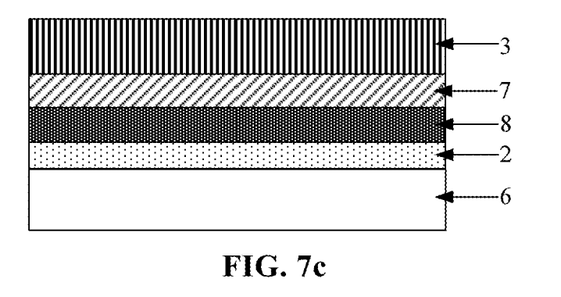

Referring to FIG. 7c, the quantum dot light emitting layer is formed on a side of the hole transport layer distal to the hole injection layer; the material of the quantum dot light emitting layer may be InP (indium phosphide) quantum dots or indium phosphide derived quantum dots having a core-shell structure, such as InP/ZnSe/ZnS, InP/ZnSeS/ZnS; also may be blue light cadmium-containing quantum dots such as CdS/ZnSe/ZnS, CdSe/ZnSe/ZnS, CdSInS/ZnSe/ZnS; and also may be quantum dots, such as GaP/ZnSe, $CsPbBr_3$/ZnS. In some embodiments, the quantum dot light emitting layer may be formed through a spin coating process.

S104, forming an electron contribution layer on a side of the quantum dot light emitting layer distal to the hole transport layer.

Figure 7D:
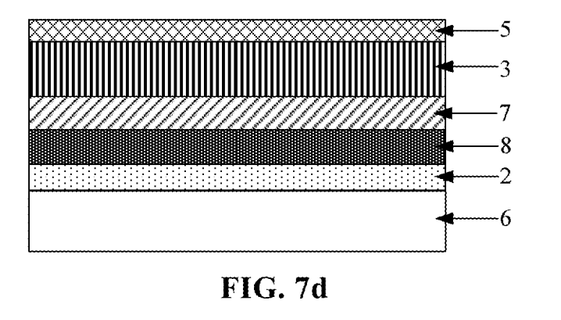
Figure 7E:
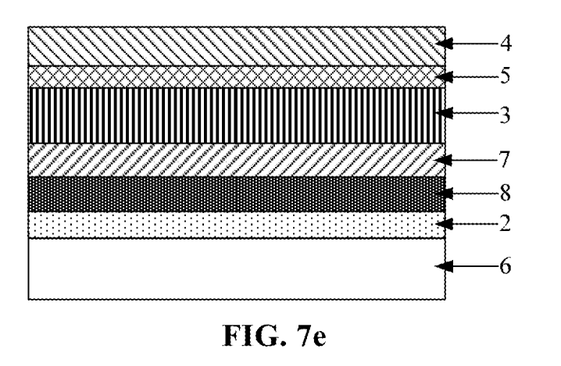

Referring to FIG. 7d, the electron contribution layer is formed at a side of the quantum dot light emitting layer distal to the hole transport layer. In some embodiments, a work function of the metal material is less than 4.0 eV. The smaller the work function of the metal material is, the more easily electrons escape from metal atoms, to form free electrons. That is, the more free electrons in the metal material are, the more electrons injected from the electron contribution layer 5 to the quantum dot light emitting layer 3 are. Therefore, in the embodiment of the present disclosure, the electron contribution layer 5 may be made of a metal material having a low work function.

In some embodiments, the metal material includes: at least one of magnesium (Mg), lithium (Li), cesium (Cs); where the work function WF for Mg is about 3.66 eV, for Li is about 2.9 eV, and for Cs is about 2.14 eV.

In some embodiments, the electron contribution layer may be formed through an evaporation process.

S105, forming an electron transport layer on the side of the electron contribution layer distal to the quantum dot light emitting layer.

As shown in FIG. 7e, the electron transport layer is formed on a side of the electron contribution layer distal to the quantum dot light emitting layer; wherein the material of the electron transport layer includes: at least one of zinc oxide (ZnO), magnesium zinc oxide, aluminum zinc oxide, and magnesium aluminum zinc oxide.

In some embodiments, the electron transport layer may be formed through a physical vapor deposition (PVD) process or a solution method. As an example, the electron transport layer may be formed through the solution method and by using the zinc oxide material. Firstly, zinc acetate (approximately 95% in concentration) and ethanolamine (approximately 4% in concentration) were dissolved in 2-methoxyethanol, to form a zinc acetate solution (approximately 75 mg/ml in density); then, the zinc acetate solution is spin-coated on the electron contribution layer at a speed of 2000 rpm; then, the substrate is subjected to an annealing process (at a temperature of approximately 180° C.), such that the zinc acetate is decomposed at the high temperature to form a zinc oxide film, thereby forming the electron transport layer.

S106, forming a first electrode on one side of the electron transport layer distal to the electron contribution layer.

Referring to FIG. 1, the first electrode is formed on a side of the electron transport layer distal to the electron contribution layer; the material of the first electrode may be a metal material, such as aluminum or an aluminum magnesium alloy. The first electrode may be formed through an evaporation process. In some embodiments of the present disclosure, a thickness of the first electrode is in the range of 500 nm to 1000 nm, wherein the thickness of the first electrode may be 500 nm or 1000 nm.

The quantum dot light emitting diode shown in FIG. 1 may be manufactured through the steps S101 to S106. In some embodiments, when the hole injection layer and the hole transport layer are absent in the quantum dot light emitting diode, the step S103 is unnecessarily performed. In addition, when the electron injection layer is present in the quantum dot light emitting diode, the method further includes a step of forming the electron injection layer between steps S105 and S106.

Figure 8:
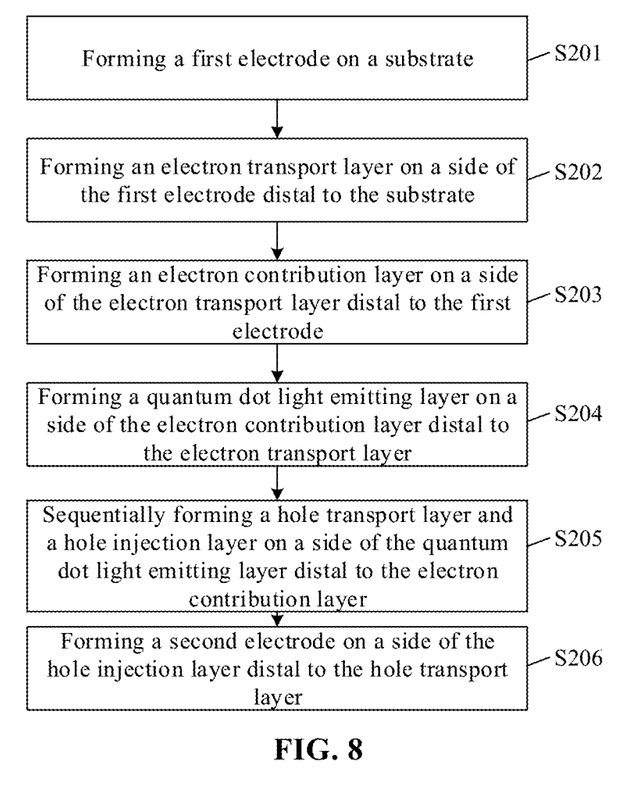
FIG. 8 is a flowchart of a method for manufacturing a quantum dot light emitting diode according to an embodiment of the present disclosure.

FIG. 8 is a flowchart of a method for manufacturing a quantum dot light emitting diode according to an embodiment of the present disclosure. As shown in FIG. 8, the manufacturing method may be used for manufacturing the quantum dot light emitting diode shown in FIG. 3, and includes the following steps:

S201, forming a first electrode on a substrate.

S202, forming an electron transport layer on a side of the first electrode distal to the substrate.

S203, forming an electron contribution layer on a side of the electron transport layer distal to the first electrode.

S204, forming a quantum dot light emitting layer on a side of the electron contribution layer distal to the electron transport layer.

S205, sequentially forming a hole transport layer and a hole injection layer on a side of the quantum dot light emitting layer distal to the electron contribution layer.

S206, forming a second electrode on a side of the hole injection layer distal to the hole transport layer.

The quantum dot light emitting diode shown in FIG. 3 may be manufactured through the steps S201 to S206. For specific processes (e.g., method and material selection) for forming the first electrode, the electron transport layer, the electron contribution layer, the quantum dot light emitting layer, the hole transport layer, the hole injection layer, and the second electrode, reference may be made to corresponding contents in the embodiment described in FIG. 7, and details are not repeated here.

Figure 9:
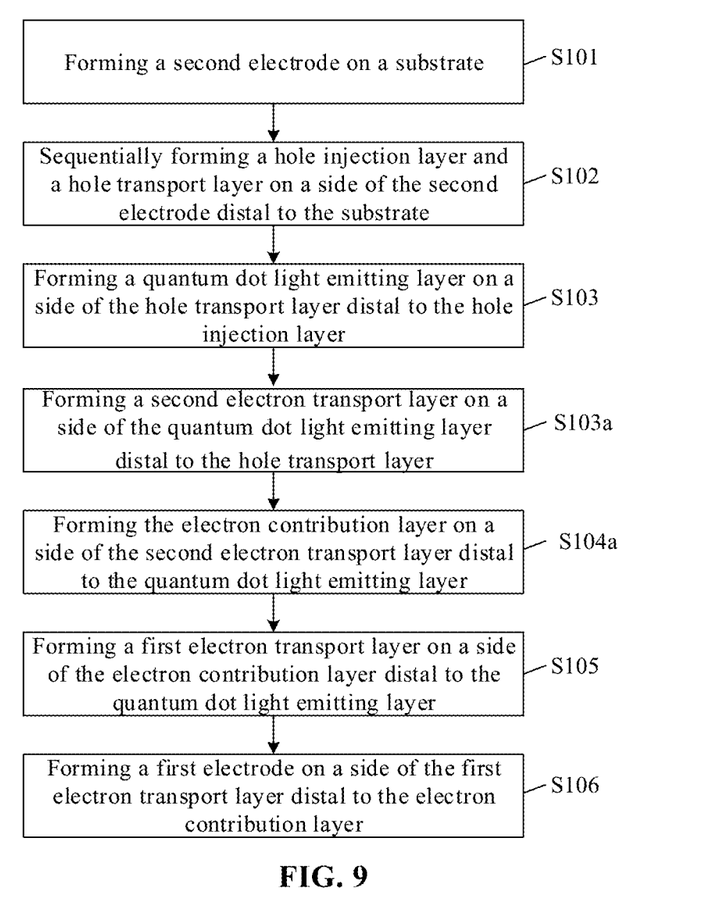
FIG. 9 is a flowchart of a method for manufacturing a quantum dot light emitting diode according to an embodiment of the present disclosure.

FIG. 9 is a flowchart of a method for manufacturing a quantum dot light emitting diode according to an embodiment of the present disclosure. As shown in FIG. 9, the manufacturing method may be used to manufacture the quantum dot light emitting diode shown in FIG. 4, and not only includes steps S101 to S106 in the embodiment shown in FIG. 6, but also includes step S103a between step S103 and step S104, which is described in detail below. Further, in FIG. 9, step S104 is replaced with step S104a.

S103a is forming a second electron transport layer on a side of the quantum dot light emitting layer distal to the hole transport layer.

S104a is forming the electron contribution layer on a side of the second electron transport layer distal to the quantum dot light emitting layer.

The electron transport layer may be formed through a physical vapor deposition process (PVD) or a solution method.

In the embodiment shown in FIG. 9, the electron transport layer manufactured in step S103a is the second electron transport layer, and the electron transport layer manufactured in step S105 is the first electron transport layer.

In the process of separately forming the first electron transport layer and the second electron transport layer through the solution method, thicknesses of the first electron transport layer and the second electron transport layer may be controlled by controlling a concentration of the spin-coating solution and the spin-coating speed.

Figure 10:
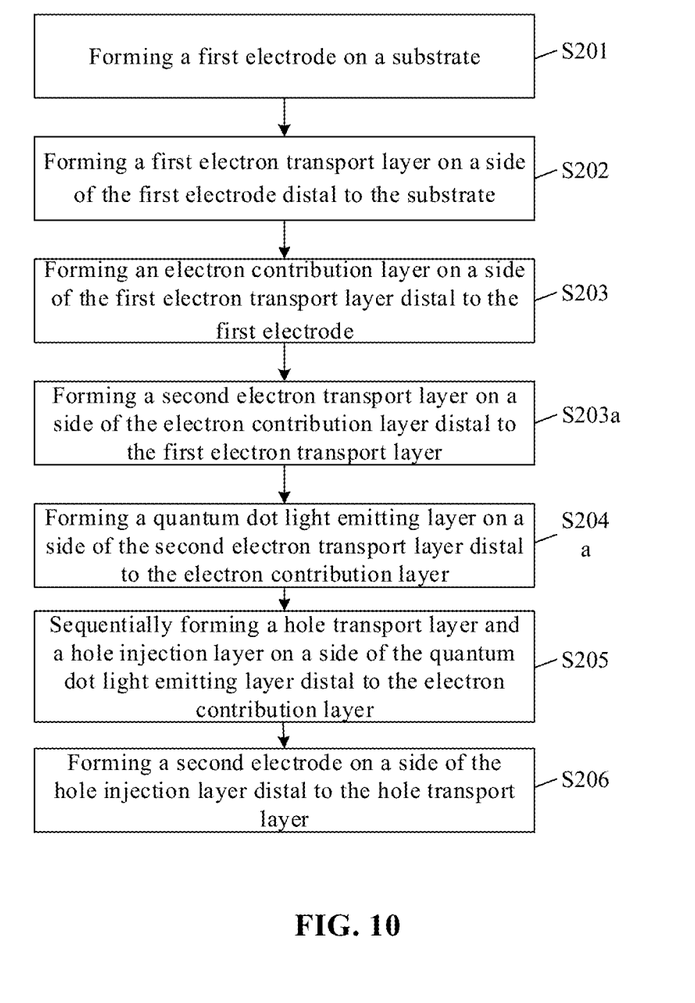
FIG. 10 is a flowchart of a method for manufacturing a quantum dot light emitting diode according to an embodiment of the present disclosure.

FIG. 10 is a flowchart of a method for manufacturing a quantum dot light emitting diode according to an embodiment of the present disclosure. As shown in FIG. 10, the manufacturing method may be used for manufacturing the quantum dot light emitting diode shown in FIG. 5, and not only includes steps S201 to S206 in the embodiment shown in FIG. 8, but also includes step S203a between step S203 and step S204, which is described in detail below. Further, in FIG. 10, step S204 is replaced with step S204a.

S203a is forming a second electron transport layer on a side of the electron contribution layer distal to the first electron transport layer.

S204a is forming a quantum dot light emitting layer on a side of the second electron transport layer distal to the electron contribution layer.

The second electron transport layer may be formed through a physical vapor deposition process (PVD) or a solution method.

In the embodiment shown in FIG. 10, the electron transport layer manufactured in step S203a is the second electron transport layer, and the electron transport layer manufactured in step S202 is the first electron transport layer.

In the above embodiments, the method for manufacturing layers has been described. However, the present disclosure is not limited thereto. In other embodiments of the present disclosure, other processes may be used to manufacture the above layers.

For example, in other embodiments of the present disclosure, the hole injection layer, the quantum dot light emitting layer, the electron transport layer, and the cathode may be manufactured using an inkjet printing method.

In the embodiment of the present disclosure, by manufacturing the electron contribution layer in the quantum dot light emitting diode, free electrons of the metal material in the electron contribution layer may be injected into the quantum dot light emitting layer under the action of the electric field, so that an electron transport rate between the first electrode and the quantum dot light emitting layer is increased, and electrons injected into the quantum dot light emitting layer per unit time are increased, the electron injection per unit time at the quantum dot light emitting layer is increased, so that the unbalanced injection between holes and electrons at the quantum dot light emitting layer is favorably alleviated or even eliminated, and thus, the service life and the light emitting efficiency of the quantum dot light emitting diode may be improved.

The embodiment of the present disclosure provides a display panel, which includes the quantum dot light emitting diode provided by any one of the foregoing embodiments, and manufactured by any one of the foregoing manufacturing methods. For the specific description of the quantum dot light emitting diode and the manufacturing method thereof, reference may be made to the corresponding contents in the foregoing embodiments, and details are not repeated here.

The embodiment of the present disclosure provides a display device, which includes the display panel provided in the foregoing embodiment, and may be any product or component with a display function, such as a television, a digital camera, a mobile phone, a tablet computer, and the like.

The display panel and the display device provided by the embodiment of the present disclosure include the quantum dot light emitting diode described herein or manufactured by the method described herein. By manufacturing the electron contribution layer in the quantum dot light emitting diode, free electrons of the metal material in the electron contribution layer may be injected into the quantum dot light emitting layer under the action of the electric field, so that an electron transport rate between the first electrode and the quantum dot light emitting layer is increased, and electrons injected into the quantum dot light emitting layer per unit time are increased, the electron injection per unit time at the quantum dot light emitting layer is increased, so that the unbalanced injection between holes and electrons at the quantum dot light emitting layer is favorably alleviated or even eliminated, and thus, the service life and the light emitting efficiency of the quantum dot light emitting diode may be improved. Further, the service life of the display panel and the display device including the quantum dot light emitting diode described herein or manufactured by the method described herein in the embodiments of the present disclosure is improved.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and essence of the present disclosure, and such changes and modifications also fall within the scope of the present disclosure.

What is claimed is:

1. A quantum dot light emitting diode, comprising:
a first electrode, a second electrode, and a quantum dot light emitting layer between the first electrode and the second electrode;
at least one electron transport layer between the quantum dot light emitting layer and the first electrode; and
an electron contribution layer between the quantum dot light emitting layer and the first electrode;
wherein the electron contribution layer is configured to inject free electrons on a surface of the electron contribution layer into the quantum dot light emitting layer under action of an electric field between the first electrode and the second electrode;
a material of the electron contribution layer comprises a metal material; and
the metal material comprises: at least one of magnesium, lithium and cesium.

2. The quantum dot light emitting diode of claim 1, wherein a thickness of the electron contribution layer is in a range of 1 nm to 100 nm.

3. The quantum dot light emitting diode of claim 1, wherein the electron contribution layer is between the quantum dot light emitting layer and an electron transport layer of the at least one electron transport layer closest to the first electrode.

4. The quantum dot light emitting diode of claim 1, wherein a work function of the metal material is less than 4 eV.

5. The quantum dot light emitting diode of claim 1, wherein the at least one electron transport layer comprises one electron transport layer, and
the electron contribution layer is between the electron transport layer and the quantum dot light emitting layer.

6. The quantum dot light emitting diode of claim 1, wherein
the electron contribution layer is between the quantum dot light emitting layer and an electron transport layer of the at least one electron transport layer.

7. A display panel, comprising: the quantum dot light emitting diode of claim 1.

8. A method for manufacturing the quantum dot light emitting diode of claim 1, comprising:
forming a first electrode, a second electrode, a quantum dot light emitting layer, at least one electron transport layer, and an electron contribution layer such that the quantum dot light emitting layer is between the first electrode and the second electrode, the at least one electron transport layer is between the quantum dot light emitting layer and the first electrode, and the electron contribution layer is between the quantum dot light emitting layer and an electron transport layer of the at least one electron transport layer closest to the first electrode;
wherein a material of the electron contribution layer comprises a metal material, and the electron contribution layer is configured to inject free electrons on a surface of the electron contribution layer into the quantum dot light emitting layer under action of an electric field between the first electrode and the second electrode.

9. The method for manufacturing a quantum dot light emitting diode of claim 8, wherein the at least one electron transport layer comprises one electron transport layer;
the forming the first electrode, the second electrode, the quantum dot light emitting layer, the at least one electron transport layer, and the electron contribution layer comprises:
forming the second electrode on a substrate;
forming the quantum dot light emitting layer on a side of the second electrode away from the substrate;
forming the electron contribution layer on a side of the quantum dot light emitting layer away from the second electrode;
forming the electron transport layer on a side of the electron contribution layer away from the quantum dot light emitting layer; and
forming the first electrode on a side of the electron transport layer away from the electron contribution layer.

10. The method for manufacturing a quantum dot light emitting diode of claim 8, wherein the at least one electron transport layer comprises one electron transport layer;
the forming the first electrode, the second electrode, the quantum dot light emitting layer, the at least one electron transport layer, and the electron contribution layer comprises:
forming the first electrode on a substrate;
forming the electron transport layer on a side of the first electrode away from the substrate;
forming the electron contribution layer on a side of the electron transport layer away from the first electrode;
forming the quantum dot light emitting layer on a side of the electron contribution layer away from the electron transport layer; and
forming the second electrode on a side of the quantum dot light emitting layer away from the electron contribution layer.

11. A quantum dot light emitting diode, comprising:
a first electrode, a second electrode, and a quantum dot light emitting layer between the first electrode and the second electrode;
at least one electron transport layer between the quantum dot light emitting layer and the first electrode; and
an electron contribution layer between the quantum dot light emitting layer and the first electrode;
wherein the electron contribution layer is configured to inject free electrons on a surface of the electron contribution layer into the quantum dot light emitting layer under action of an electric field between the first electrode and the second electrode, wherein the at least one electron transport layer comprises a plurality of electron transport layers, and
the electron contribution layer is between any two adjacent electron transport layers in the plurality of electron transport layers.

12. The quantum dot light emitting diode of claim 11, wherein a material of the electron contribution layer comprises a metal material; and
the metal material comprises: at least one of magnesium, lithium and cesium.

13. A display panel, comprising: the quantum dot light emitting diode of claim 11.

14. A quantum dot light emitting diode, comprising:
a first electrode, a second electrode, and a quantum dot light emitting layer between the first electrode and the second electrode;
at least one electron transport layer between the quantum dot light emitting layer and the first electrode; and
an electron contribution layer between the quantum dot light emitting layer and the first electrode;

wherein the electron contribution layer is configured to inject free electrons on a surface of the electron contribution layer into the quantum dot light emitting layer under action of an electric field between the first electrode and the second electrode, wherein the electron contribution layer is arranged on a side of an electron transport layer of the at least one electron transport layer away from the quantum dot light emitting layer.

15. The quantum dot light emitting diode of claim 14, wherein a material of the electron contribution layer comprises a metal material; and the metal material comprises: at least one of magnesium, lithium and cesium.

16. A display panel, comprising: the quantum dot light emitting diode of claim 14.

* * * * *